(12) United States Patent
Marx et al.

(10) Patent No.: US 6,638,402 B2
(45) Date of Patent: Oct. 28, 2003

(54) RING-TYPE SPUTTERING TARGET

(75) Inventors: Daniel R. Marx, Santa Barbara, CA (US); Rajan Mathew, Nanuet, NY (US); Alfred Snowman, Englewood, NJ (US); Charles R. Fisher, Pomona, NY (US)

(73) Assignee: Praxair S.T. Technology, Inc., North Haven, CT (US)

( * ) Notice: Subject to any disclaimer, the term of this patent is extended or adjusted under 35 U.S.C. 154(b) by 0 days.

(21) Appl. No.: 09/873,184

(22) Filed: Jun. 5, 2001

(65) Prior Publication Data
US 2003/0075437 A1 Apr. 24, 2003

(51) Int. Cl.$^7$ ............................................. C23C 14/34
(52) U.S. Cl. ........................... 204/298.12; 204/192.12
(58) Field of Search ....................... 204/298.12, 298.13, 204/192.12, 192.15

(56) References Cited
U.S. PATENT DOCUMENTS 6,068,742 A    5/2000  Daxinger et al. ...... 204/298.09

FOREIGN PATENT DOCUMENTS

| EP | 1087033 | 3/2001 |
|----|---------|--------|
| JP | 583977  | 1/1983 |
| JP | 4173965 | 6/1992 |

Primary Examiner—Patrick Ryan
Assistant Examiner—Gregg Cantelmo
(74) Attorney, Agent, or Firm—Iurie Schwartz

(57) ABSTRACT

The sputtering target has a design for uniformly depositing a material on a substrate. The target contains a circular disk; and the disk has a radius and a top surface. The top surface has a center region within the inner half of the radius, an outer ring-shaped region within the outer half of the radius and a base region separating the center region from the ring-shaped region. The outer ring-shaped region has a projection height for extending the life of the sputtering target. The center region has a projection height of less than the projection height of the outer ring-shaped region for increasing the sputtering deposition rate on the substrate adjacent the center region.

19 Claims, 3 Drawing Sheets

RING-TYPE SPUTTERING TARGET

FIELD OF THE INVENTION

This invention relates to extended life sputtering targets and a method for using these extended life sputtering targets.

BACKGROUND OF THE INVENTION

Sputtering is a process that coats semiconductor wafers or other substrates within inert-gas-filled processing chambers. These chambers contain sputtering targets and an electrically biased wafer adjacent the sputtering target. An electric field within the chambers ionizes the inert gas and dislodges atoms from the target to deposit sputter target material on the wafer. Typically, processing chambers may contain magnetrons that generate annular groove patterns in portions of the sputtering targets. Unfortunately, these grooves can dramatically shorten a sputtering targets' life. Furthermore, the adverse effect of these grooves tends to become exaggerated for targets having increased diameters.

Several patents disclose raised rings or surfaces for increasing target life. For example, Strauss et al., in EP Pat. Pub. No. 1 087 033, disclose sputtering targets having two spaced annular rings. These rings correspond to target areas that experience the greatest erosion during sputtering. Daxinger et al., in U.S. Pat. No. 6,068,742, disclose a reversible sputtering target. Each side of this target contains two circumferentially-shaped protrusions designed to increase target life. Masahura, in Japanese Pat. Pub. No. 4-173965 discloses a target containing a single projection ring. The projection ring has a smooth surface to prevent re-sticking of target material and a rough surface adjacent the smooth-surfaced rings. This combination decreases dusting effects over the sputtering process' entire life.

Recently, a ring-enhanced design has proven effective for sputtering layers used to construct memory chips. Since memory chips typically contain only two metal layers, film uniformity is not critical for these memory applications. Unlike memory chip applications, logic chip applications often require greater film uniformity. Unfortunately, targets containing ring-enhanced designs fail to produce the stringent film uniformity required for some logic applications. This may result from the increased number of layers deposited or the device design rules. Furthermore, since there are more metal layers in logic applications, poor uniformity becomes accentuated with each succeeding layer when a manufacturer skips chemical mechanical polishing (CMP) of the deposited layers. As the stacked film uniformity decreases, photolithography on the upper layers becomes more difficult.

Film uniformity is also important from a device fabrication standpoint. There is often some degree of over-etch when etching the device. If the etching is greatest in the wafer's center and the film is thinner in the center, then there is an increased possibility of device yield loss.

Furthermore, a lack of uniformity has a pronounced effect on film thickness and sheet resistance uniformity for large targets, such as those having a diameter in excess of 250 mm. In these large diameter targets, the rings can have a negative impact upon a target's useful life. As far as known, none of these ring-enhanced designs has received commercial acceptance for stringent device applications due to the above uniformity issue or other sputtering-induced defects.

SUMMARY OF THE INVENTION

The sputtering target has a design for uniformly depositing a material on a substrate. The target contains a circular disk; and the disk has a radius and a top surface. The top surface has a center region within the inner half of the radius, an outer ring-shaped region within the outer half of the radius and a base region separating the center region from the ring-shaped region. The outer ring-shaped region has a projection height for extending the life of the sputtering target. The center region has a projection height of less than the projection height of the outer ring-shaped region for increasing the sputtering deposition rate on the substrate adjacent the center region.

The method sputters a material on a substrate with a sputtering target or cathode. First ionizing an inert gas adjacent a cathode in a sputtering chamber prepares the chamber for sputtering. The cathode has an initial wafer to cathode spacing and a second wafer to cathode spacing for uniform sputtering. The second wafer to cathode spacing is greater than the initial wafer to cathode spacing. Dislodging atoms from the cathode with a rotating magnetron deposits a coating on the wafer using the initial wafer to cathode spacing. The initial spacing optimizes sputtering deposition uniformity for an initial period of time. Then dislodging additional atoms from the cathode with the rotating magnetron after the initial period of time deposits the coating on the wafer using the second wafer to cathode spacing. The second wafer to cathode spacing optimizes sputtering deposition uniformity during a second period of time.

DETAILED DESCRIPTION

Targets containing a raised outer ring and a lesser-raised inner region have resulted in improved sputter uniformity. This target has successfully performed with a conventional sputtering system and exhibits low sheet resistance (Rs) at the center of the wafer. Sheet resistance is an indirect method for comparing deposit thickness at several locations by measuring resistance to electrical flow.

The target advantageously has an initial optimal wafer to cathode spacing for uniform sputtering and a second wafer to cathode spacing for uniform sputtering. The second wafer to cathode spacing is greater than the initial wafer to cathode spacing. This shift in optimal wafer to cathode spacing advantageously occurs after sputtering at least about thirty percent of the cathode's life to further improve performance. Most advantageously, the shift occurs after sputtering at least about forty percent of the cathode's life. The exact distance of the initial and second location for optimum sputtering before and after the shift tends to vary from machine to machine. In addition, it is possible to adjust or shift the position more than one time to maintain optimal sputtering performance. But testing has shown that one shift after a set period of time provides excellent uniformity with minimal operator inconvenience.

Figure 1B:
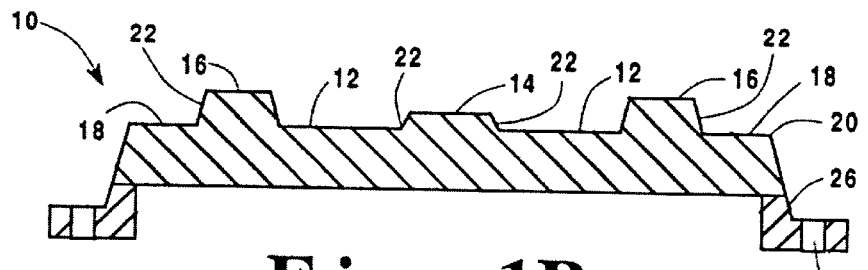
FIG. 1B is a cross section of the sputtering target of FIG. 1A taken along line 1—1.
Figure 1A:
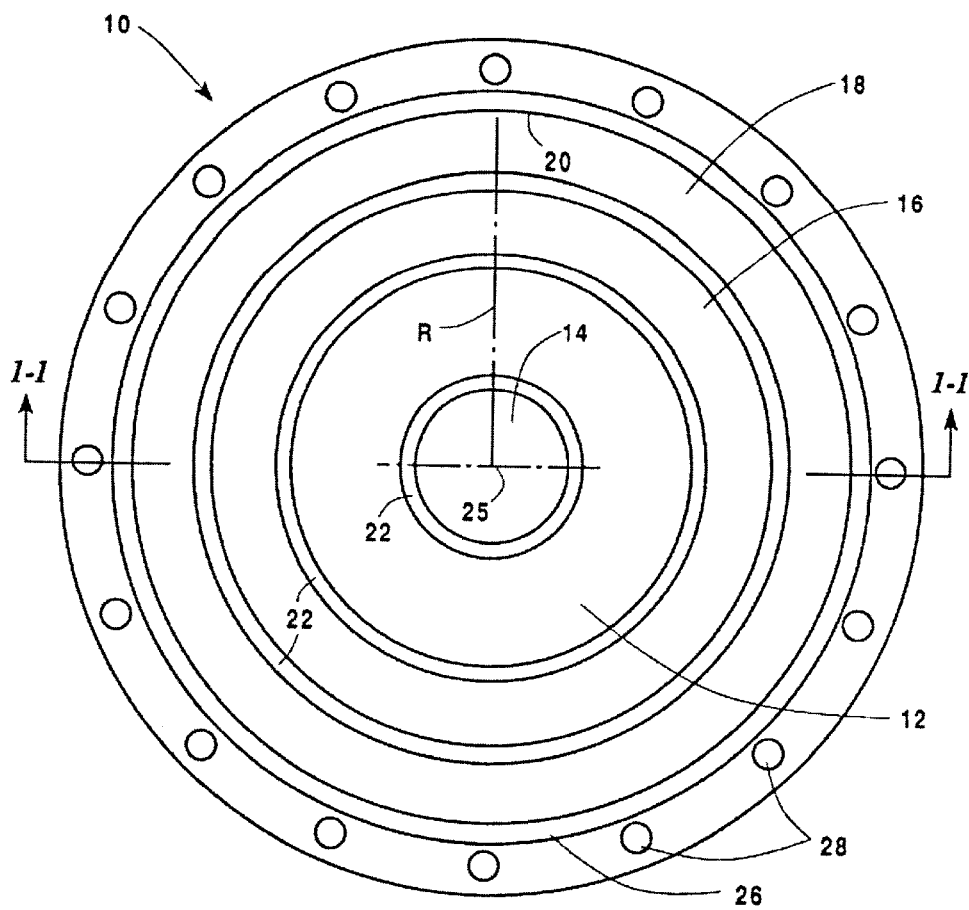
FIG. 1A is a top view of a sputtering target containing a disk-shaped center region.

Referring to FIGS. 1A and 1B, the target 10 contains a base region 12, a disk-shaped center region 14 and an outer ring-shaped region 16. Advantageously, ring-shaped region 16 extends upwardly adjacent an outer edge region 18 and outer edge 20. Most advantageously, the outer edge region 18 has a thickness equal to the thickness of the base region 14. Optionally, the ring-shaped region 16 can extend outwardly to the outer edge 20.

The target 10 has a radius R extending from the center 25 to the outer edge 20. The inner half of the radius contains the center region 14 and the outer half of the radius contains the ring-shaped region 16. Advantageously, the center region 14 is within about the inner thirty-five percent of the radial distance from the center 25 and the outer edge 20 and most advantageously within about the inner thirty percent. Similarly, the outer ring-shaped region 16 is most advantageously between seventy and ninety-five percent of the radial distance from the center 25 and the outer edge 20.

Center regions formed with a solid disk-like projection of uniform height have proven effective. Optionally, tapered regions 22 located between the base region 12 and the center region 14 and between the base region 12 and the ring-shaped region 16 serve to level-out sputtering in areas prone to non-uniform sputtering. In addition, flange 26 containing threaded openings 28 facilitates fastening of the sputtering target within a sputtering chamber.

FIG. 1B illustrates the difference in projection height between the outer ring-shaped region 16 and the center region 14. The projection height is a measure of the difference in thickness between the base region 12 and the center region 14 or the outer ring-shaped region 16. The decrease in projection height of the center region 14 in relation to the outer ring-shaped region 16 unexpectedly increases uniformity of the deposit. Furthermore, this advantageously results in the dislodging of atoms occurring at a greater rate in the center region and the outer ring-shaped region than in the base region.

Advantageously, the center region 14 has a projection height of at least less than about 20 percent of the outer ring-shaped region 16. For example, if the outer region 16 had a height of 5 mm, the center region 14 would have a height of 4 mm or less. Preferably, the center region 14 has a projection height that has a projection height of about 20 to 80 percent of the outer region's projection height. If a ring-containing target contains a center region that has no projection height, then the sputtering target performs poorly. Most advantageously, the center region 14 has a height that is about 30 to 70 percent of the outer ring-shaped region's projection height. A nominal center region projection height decrease of about 50 percent of the outer ring-shaped region 16 has proven most effective.

Figures 2A, 2B:
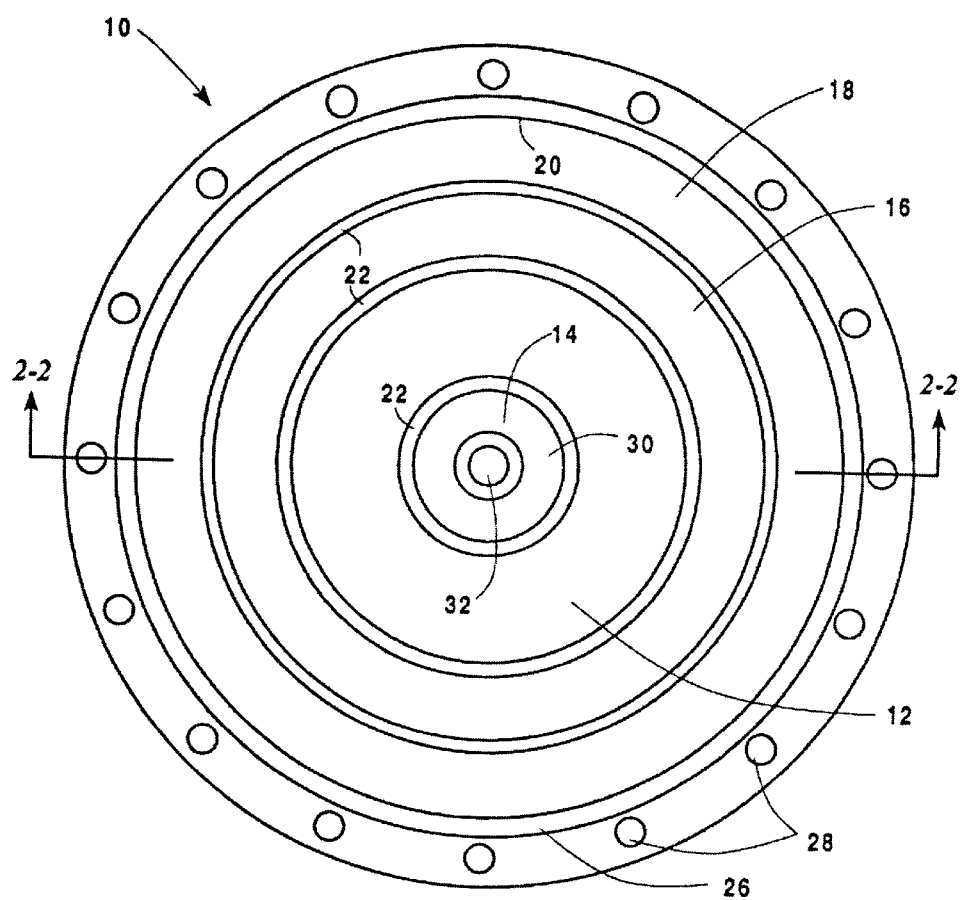
FIG. 2A is a top view of a sputtering target containing a ring-shaped center region.
FIG. 2B is a cross section of the sputtering target of FIG. 2A taken along line 2—2.

FIGS. 2A and 2B illustrate an optional embodiment where the center region 14 includes a disk-shaped projection 30. In this embodiment, the disk-shaped projection 30 contains a dimpled region 32. optionally, the dimpled region 32 has a thickness less than, equal to or greater than the base region 32. Most advantageously, the dimpled region 32 has a thickness equal to the base region 12. In addition, the dimpled region 32 may have a circular, star-pattern or other symmetrical or semi-symmetrical shape. Most advantageously, the dimpled region 32 has a symmetrical shape, such as the illustrated cylindrical shape.

Comparative Example

Figure 3:
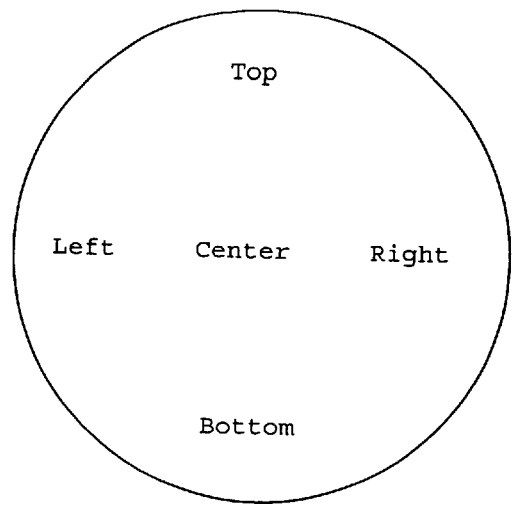
FIG. 3 is a schematic drawing that illustrates locations for measuring wafer film thickness.

A partially spent 300 mm diameter AlCu (0.5%) target having two-concentric projecting rings (4 mm height) produced film thickness uniformity out of a narrow specification after approximately 800 kwh of sputtering with an Endura System using an A-Type magnet(target installed in chamber 4 and a standard set of shields)—this system also provided the sputtering device for the Example below. The system's magnetron contains several magnets that spin about an axis to generate a more uniform field. Unfortunately, the spinning magnetron produces higher sheet resistance values at the center of the wafer than on the outside diameter (6 mm from edge)—see FIG. 3. This indicated a lower film thickness in the center of the wafer as compared to the outer area of the wafer.

Additional tests were run after the center of the target was modified by machining the inner ring to form a thin disc having a height of 2 mm. The target's 4 mm outer ring had worn to form a groove-like depression. After completion of these center modifications, the target was burned-in to 5 kwh prior to the testing. Tables 1 and 2 present the sheet resistance (Rs) uniformity and thickness data respectively for the partially spent 4 mm concentric ring and the modified-center version.

Table 1 measures Rs uniformity—(Percent 1 Sigma or one standard deviation) for a 200 mm oxide wafer at 49 sites using a 6 mm edge exclusion.

TABLE 1

| | Rs Uniformity (Percent 1 Sigma) | | | |
|---|---|---|---|---|
| Wafer/Cathode Spacing | ~884 kwh 4 mm Concentric Rings | | ~890 kwh After Center Modification | |
| (mm) | Wafer A | Wafer B | Wafer C | Wafer D |
| 46 | 2.81 | | 1.98 | |
| 48 | 2.28 | | 1.00 | |
| 50 | 1.52 | | 0.72 | |
| 51 | 1.39 | | 0.64 | |
| 52 | 1.16 | 1.32 | 0.85 | 0.99 |
| 53 | 1.23 | | 0.84 | |

Table 1 illustrates an unexpected shift in optimum wafer to cathode spacing resulting from reducing the inner ring height. In addition, the modified center design improved Rs uniformity.

TABLE 2

| | Average Film Thickness | |
|---|---|---|
| Location | ~884 kwh 4 mm Concentric Rings | After Center Modification |
| Center | 9738 Å | 9382 Å |
| Bottom | 10104 Å | 9454 Å |
| Right | 10062 Å | 9437 Å |
| Top | 10092 Å | 9465 Å |
| Left | 10090 Å | 9365 Å |
| Delta | 366 Å | 100 Å |

Table 2 data originate from operating the Endura system for 60 seconds at 10.6 kw, with an 18 sccm chamber/15 sccm backing plate flow of argon at a temperature of 300° C. with a wafer to cathode spacing of 52 mm and a chamber pressure of 2 milliTorr. Delta measures the maximum difference in thickness (Å) between the center reading and any of the four outside diameter readings top, left, bottom and right at locations near the outside diameter in accordance with FIG. 3 (Standard Five-Point Test). Testing at a greater number of sites tends to lower the standard deviation or sigma value. Therefore, since the Standard Five-Point Test tests at only five sites, it is much more stringent than alternative tests that measure thickness at several locations.

Example

An Al—Cu(0.5%) sputtering target manufactured with a 4 mm high outer ring, having a 1.18 in. (3.0 cm) width, and a 2 mm high inner disc, having a 3.54 in. (9.0 cm) diameter, improved both sheet resistance and film thickness uniformity. Depositing approximately 1 micron films onto 200 mm thermal oxide wafers provided a basis for measuring targets' performance. Standard process conditions were used for the evaluation as follows:

| Power | 10.6 kw |
|---|---|
| Argon Flow (chamber) | 18 sccm |
| Argon flow (Backing plate) | 15 sccm |
| Chamber pressure | 2.04 mTorr |
| Temperature | 300° C. |
| Target to wafer spacing | 46 mm & 52 mm (thickness) Variable (Rs uniformity) |

Rs uniformity was measured at 49 sites on the 200 mm wafers using a 4D automated 4 point probe. A 6 mm edge exclusion was used. The film thicknesses were measured at 5 location on each wafer in accordance with the Standard Five-Point Test. The initial testing was completed at 3, 7 and 15 kwh for Rs Uniformity (Table 3) and 3, 5, 7, 9, 12 and 15 kwh intervals for film thickness (Table 4). The film thickness and Rs Uniformity measurements were made at a standard wafer to cathode spacing of 52 mm. In addition, tests completed at 100, to 1400 kwh relied upon varied wafer to cathode distances (44 to 53 mm) to locate the optimum spacing for the deposition of low Rs uniformity Table 3 shows the Rs uniformity results for the target with different wafer to cathode spacings.

These data indicate an unexpected initial decrease in optimum wafer to cathode distance for achieving maximum uniformity. The target having a center region of decreased thickness reduced the initial optimum wafer to cathode spacing to about 46 mm—a 6 mm two-ring target had an optimum uniformity with a wafer to cathode spacing between 50 and 52 mm. Then after approximately 900 kwh of sputtering, the optimum wafer to cathode distance increased to 52 mm.

Table 4 illustrates the uniformity in film thickness achieved with a wafer to cathode spacing of 52 mm.

TABLE 4

| Kwh | Center | Top | Left | Bottom | Right | Delta |
|---|---|---|---|---|---|---|
| 3 | 10394 | 10263 | 10225 | 10287 | 10245 | 169 |
| 5 | 10403 | 10177 | 10185 | 10152 | 10185 | 251 |
| 7 | 10659 | 10347 | 10302 | 10385 | 10325 | 357 |
| 9 | 10620 | 10320 | 10357 | 10317 | 10337 | 303 |
| 12 | 10738 | 10467 | 10342 | 10342 | 10452 | 396 |
| 15 | 11009 | 10455 | 10522 | 10457 | 10530 | 554 |
| 100 | 11042 | 10535 | 10435 | 10477 | 10457 | 607 |
| 300 | 10665 | 10115 | 10157 | 10085 | 10092 | 580 |
| 500 | 10837 | 10887 | 10800 | 10851 | 10910 | 110 |
| 700 | 9480 | 9563 | 9510 | 9472 | 9521 | 91 |
| 900 | 9289 | 9144 | 9101 | 9285 | 9192 | 188 |
| 1100 | 9008 | 9021 | 8960 | 9080 | 9011 | 120 |
| 1300 | 8625 | 8459 | 8424 | 8446 | 8462 | 201 |
| 1400 | 8100 | 7977 | 7898 | 8102 | 8071 | 204 |

TABLE 3

| | Target Life/Rs Uniformity (Percent 1 Sigma) | | | | | | | |
|---|---|---|---|---|---|---|---|---|
| Wafer/Cathode | 3 kwh | | 7 kwh | | 15 kwh | | 100 kwh | |
| Spacing (mm) | Wafer #1 | Wafer #2 | Wafer #1 | Wafer #2 | Wafer #1 | Wafer #2 | Wafer #1 | Wafer #2 |
| 44 | | | 1.00% | 1.22% | 1.12% | 1.01% | 1.17% | 1.08% |
| 46 | | | 0.75% | 0.80% | 0.86% | 0.89% | 0.70% | 0.62% |
| 48 | | | 1.16% | 1.11% | 0.93% | 0.72% | 0.97% | 1.10% |
| 50 | | | 1.11% | 1.13% | 1.39% | 1.82% | 1.56% | 1.45% |
| 52 | 1.95% | 2.02% | 1.62% | 1.44% | 1.79% | 1.88% | 1.59% | 1.89 |
| 53 | | | 2.02% | 1.74% | 1.88% | 1.93% | 2.02% | 2.37% |

| | Target Life/Rs Uniformity (Percent 1 Sigma) | | | | | | | |
|---|---|---|---|---|---|---|---|---|
| Wafer/Cathode | 300 kwh | | 500 kwh | | 700 kwh | | 900 kwh | |
| Spacing (mm) | Wafer #1 | Wafer #2 | Wafer #1 | Wafer #2 | Wafer #1 | Wafer #2 | Wafer #1 | Wafer #2 |
| 44 | 1.13% | 1.10% | 1.85% | 1.80% | 2.12% | 2.04% | 1.64% | 1.84% |
| 46 | 0.92% | 0.77% | 0.79% | 1.05% | 1.14% | 1.09% | 1.31% | 1.54% |
| 48 | 1.14% | 1.18% | 0.92% | 0.75% | 0.75% | 0.93% | 0.69% | 0.84% |
| 50 | 1.17% | 1.46% | 1.45% | 1.33% | 0.75% | 0.55% | 0.69% | 0.57% |
| 52 | 1.68% | 1.54% | 1.71% | 1.49% | 1.24% | 1.41% | 1.35% | 1.01% |
| 53 | 2.27% | 2.03% | 1.33% | 1.50% | 1.29% | 1.44% | 1.78% | 1.58% |

| | Target Life/Rs Uniformity (Percent 1 Sigma) | | | | | |
|---|---|---|---|---|---|---|
| Wafer/Cathode | 1100 kwh | | 1300 kwh | | 1400 kwh | |
| Spacing (mm) | Wafer #1 | Wafer #2 | Wafer #1 | Wafer #2 | Wafer #1 | Wafer #2 |
| 44 | 2.24% | 2.37% | 2.07% | 2.39% | 2.18% | 2.61% |
| 46 | 1.99% | 1.87% | 1.42% | 2.14% | 1.54% | 1.60% |
| 48 | 1.19% | 1.08% | 1.52% | 1.26% | 1.28% | 1.26% |
| 50 | 1.23% | 1.09% | 1.35% | 1.33% | 0.65% | 0.78% |
| 52 | 0.79% | 0.96% | 1.19% | 1.15% | 0.79% | 1.08% |
| 53 | 1.42% | 1.18% | 1.50% | 1.27% | 1.00% | 1.18% |

As shown above and illustrated in FIG. 4, the delta in film thickness uniformity between the wafer center and outer diameter appears to follow the Rs uniformity data. Accordingly, the thickness differences were minimum at the lower Rs uniformity test points for the bulk of the target's life. Toward the end of the target's life however, there appears to be some divergence in this correlation.

Table 5 compares the delta thickness measurement results obtained for the target with a Standard Five-Point Test after each test period with a standard wafer to cathode spacing of 52 mm and at an optimum spacing of 46 mm.

TABLE 5

| | Thickness Delta | | Optimum Wafer to Cathode Spacing 46 mm | Standard Wafer to Cathode Spacing 52 mm |
|---|---|---|---|---|
| kwh | 52 mm (Å) | 46 mm (Å) | Rs Uniformity (% 1 Sigma) | Rs Uniformity (% 1 Sigma) |
| 100 | 607 | 50 | 0.70% | 1.59% |
| 300 | 580 | 80 | 0.92% | 1.68% |
| 500 | 110 | 90 | 0.79% | 1.71% |
| 700 | 91 | 188 | 1.14% | 1.24% |
| 900 | 188 | 161 | 1.31% | 1.01% |
| 1100 | 120 | 189 | 1.99% | 0.79% |
| 1300 | 201 | 207 | 1.42% | 1.19% |
| 1400 | 204 | 95 | 1.54% | 0.79% |

Figure 4:
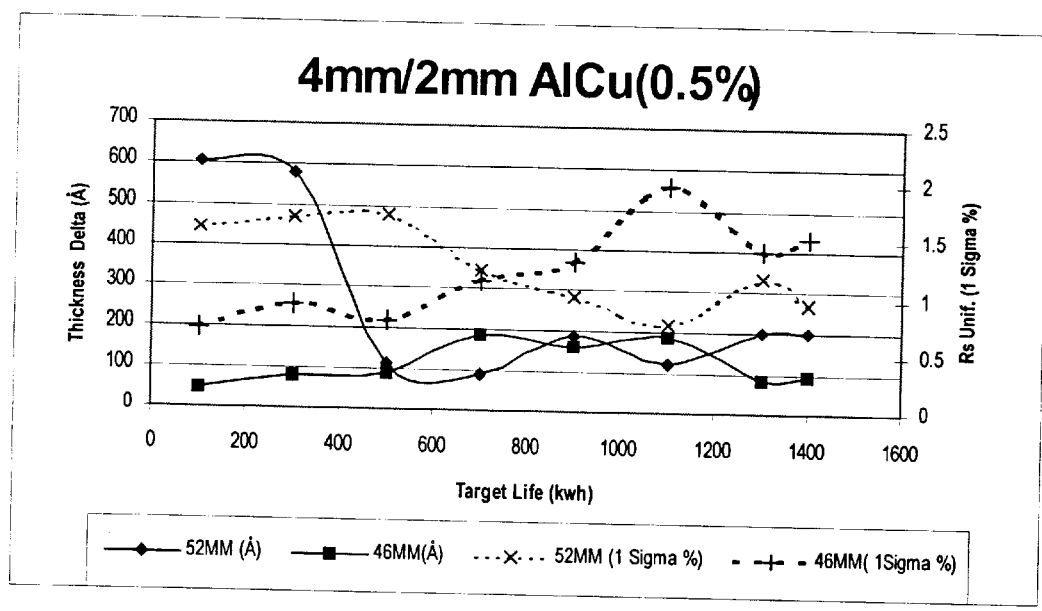
FIG. 4 illustrates the improved uniformity achieved with the center region design.

The data of Table 5 and FIG. 4 illustrate a two-part art method for optimizing sheet resistance or Rs uniformity. First, the optimal wafer to cathode spacing shifts inward in comparison to planar targets to 46 mm. Then, after the target burns for at least about 900 hours the spacing increases to 52 mm. This shift enables sputtering manufacturers to maintain Rs uniformity at a level less than about 1.5 percent one sigma and a maximum delta thickness of about 250 Å for the Standard Five Point Test. Most advantageously, it maintains Rs uniformity at a level less than about 1.3 percent one sigma.

Table 6 provides film thickness data for various 200 mm Al/Cu.5% targets, measured at 100 kwh with optimum wafer to cathode (W/C) spacings.

target has been successfully sputtered in a conventional sputtering system to produce high uniformity deposits. The target is particularly effective for aluminum and aluminum alloy sputter target designs. For example, the target coats substrates with a maximum of about 1.5 percent sigma sheet resistance uniformity. Furthermore, it has a life of at least 1000 kwh in a spinning magnetron sputtering chamber using a type A magnet. Most advantageously, the target has a life of at least 1200 kwh and has successfully tested to a life of at least 1400 kwh. This compares favorably to conventional planar designs that have a target life of approximately 900 kwh.

Many possible embodiments may be made of this invention without departing from the scope thereof, it is understood therefore that all matter set forth herein is to be interpreted as illustrative and not in a limiting sense.

We claim:

1. A sputtering target for depositing a material on a substrate comprising a circular disk, the disk having a sputter life, a radius and a top surface, the top surface having a center region within the inner half of the radius, the center region having a sputtering deposition rate, an outer ring-shaped region within the outer half of the radius and a base region separating the center region from the outer ring-shaped region, the outer ring-shaped region having a projection height for extending the sputter life of the sputtering target and the center region having a projection height of less than the projection height of the outer ring-shaped region as measured from the base region for increasing the sputtering deposition rate on the substrate adjacent the center region and improving sputtering uniformity.

2. The sputtering target of claim 1 wherein the center region is a solid disk-shaped projection of uniform height.

3. The sputtering target of claim 1 wherein the center region contains a disk-shaped projection and a dimpled region within the disk-shaped projection.

4. The sputtering target of claim 1 wherein the center region has a projection height of at least about 20 percent less than the projection height of the outer ring-shaped region as measured from the base region.

5. A sputtering target for depositing a material on a substrate comprising a circular disk, the disk having a sputter life, a radius and a top surface, the top surface having

TABLE 6

| Target ID | Life (kwh) | Details | W/C (mm) | Center (Å) | Top (Å) | Left (Å) | Bottom (Å) | Right (Å) | Delta (Å) |
|---|---|---|---|---|---|---|---|---|---|
| A | 880 | 4 mm Rings | 52 | 9738 | 10104 | 10062 | 10092 | 10090 | 366 |
| C | 100 | 4 mm No-Rings | 52 | 10610 | 10730 | 10650 | 10620 | 10652 | 120 |
| D | 100 | 6 mm Rings | 52 | 11477 | 11040 | 11015 | 11212 | 10972 | 505 |
| E | 100 | 4 mm outer ring only | 52 | 11577 | 10682 | 10797 | 10737 | 10635 | 942 |
| A1 | 885 | After center modified | 52 | 9382 | 9454 | 9437 | 9465 | 9365 | 100 |
| 1A | 100 | 4 mm-Outer/2 mm Inner | 52 | 11042 | 10535 | 10435 | 10477 | 10457 | 607 |
| 2B | 100 | 4 mm-Outer/2 mm Inner | 46 | 11067 | 11030 | 11017 | 11020 | 11062 | 50 |
| 1A | 300 | 4 mm-Outer/2 mm Inner | 52 | 10665 | 10115 | 10157 | 10085 | 10092 | 580 |
| 2B | 300 | 4 mm-Outer/2 mm Inner | 46 | 10715 | 10702 | 10782 | 10780 | 10752 | 80 |
| 1A | 500 | 4 mm-Outer/2 mm Inner | 52 | 10837 | 10887 | 10800 | 10851 | 10910 | 110 |
| 2B | 500 | 4 mm-Outer/2 mm Inner | 46 | 10189 | 10180 | 10200 | 10270 | 10245 | 90 |

Targets containing a raised outer ring and a lesser-raised inner region facilitate improved sputter uniformity. This a center region within the inner thirty-five percent of the radius, the center region having a sputtering deposition rate, an outer ring-shaped region within the outer sixty percent of the radius and a base region separating the center region from the outer ring-shaped region, the outer ring-shaped region having a projection height for extending the sputter life of the sputtering target and the center region having a projection height of about 20 to 80 percent less than the projection height of the outer ring-shaped region as measured from the base region for increasing the sputtering deposition rate on the substrate adjacent the center region and improving sputtering uniformity.

6. The sputtering target of claim 5 wherein the center region is a solid disk-shaped projection of uniform height.

7. The sputtering target of claim 5 wherein the center region contains a disk-shaped projection and a dimpled region within the disk-shaped region.

8. The sputtering target of claim 5 having a first tapered region between the base region and the center region and a second tapered region between the base region and the outer ring-shaped region.

9. The sputtering target of claim 5 wherein the projection height of the center region is about 30 to 70 percent less than the projection height of the outer ring-shaped region as measured from the base region.

10. The sputtering target of claim 5 wherein the disk has a center and an outer edge and the center region is within the inner thirty percent of the radial distance between the center and the outer edge and the outer ring-shaped region is between seventy and ninety-five percent of the radial distance between the center and the outer edge.

11. The sputtering target of claim 5 wherein the sputtering target is aluminum or an aluminum alloy and the sputtering target coats the substrate with a maximum of about 1.5 percent sigma sheet resistance uniformity and the sputter life is at least 1000 kwh in a spinning magnetron sputtering chamber using a type A magnet.

12. A method for sputtering a material onto a substrate comprising:

ionizing an inert gas adjacent a circular cathode in a sputtering chamber, the cathode having a sputter life, a radius and a top surface, the top surface having a center region with the inner half of the radius, an outer ring-shaped region within the outer half of the radius and a base region separating the center region from the outer ring-shaped region, the outer ring-shaped region having a projection height for extending the sputter life of the cathode and the center region having a projection height of less than the projection height of the outer ring-shaped region as measured from the base region for increasing the sputtering deposition rate and improving sputtering uniformity; and dislodging material from the cathode with a rotating magnetron to deposit the material onto the substrate.

13. The method of claim 12 wherein the dislodging of material occurs at a greater rate in the center region and in the outer ring-shaped region than in the base region.

14. The method of claim 12 wherein the cathode coats the substrate with a maximum 1.3 percent sigma sheet resistance uniformity and the cathode sputter life is at least 1000 kwh using a type A magnet.

15. The method of claim 12 wherein the cathode has an initial substrate to cathode spacing and a second substrate to cathode spacing substrate to cathode spacing being greater than the initial substrate to cathode spacing, and further comprising the step of moving the cathode after an initial period of time from the initial substrate to cathode spacing to the second substrate to cathode spacing to optimize sputtering deposition uniformity.

16. The method of claim 15, further comprising the step of moving the cathode fro the initial substrate to cathode spacing to the second substrate to cathode spacing after sputtering at least about thirty percent of the cathode sputter life.

17. The method of claim 15 further comprising the step of moving the cathode from the initial substrate to cathode spacing to the second substrate to cathode spacing after sputtering at least about forty percent of the cathode sputter life.

18. The method of claim 15 wherein the cathode is moved from the initial substrate to cathode spacing to the second substrate to cathode spacing no more than one time during the deposition of a material on a substrate.

19. The method of claim 12 wherein the cathode has an initial substrate to cathode spacing and a second substrate to cathode spacing, the second substrate to cathode spacing being greater than the initial substrate to cathode spacing, and wherein disloding material from the cathode with a rotating magnetron to deposit the material onto the substrate comprises dislodging material from the cathode to deposit a first portion of a coating on the substrate using the initial substrate to cathode spacing to optimize sputtering deposition uniformity for an initial period of time; and dislodging additional material from the cathode after the initial period of time to deposit a second portion of the coating on the substrate using the second substrate to cathode spacing to optimize sputtering deposition uniformity for a second period of time.

* * * * *